United States Patent
Huang et al.

(10) Patent No.: US 6,266,021 B1
(45) Date of Patent: Jul. 24, 2001

(54) APPARATUS AND METHOD FOR DETERMINING RETURN LOSS OF ELECTRICAL DEVICE

(75) Inventors: Guanghua Huang, Prior Lake; Teppo Lukkarila, Eagan, both of MN (US)

(73) Assignee: ADC Solitra, Inc.

( * ) Notice: Subject to any disclaimer, the term of this patent is extended or adjusted under 35 U.S.C. 154(b) by 0 days.

(21) Appl. No.: 09/247,379

(22) Filed: Feb. 10, 1999

(51) Int. Cl.$^7$ ........................................... H04B 1/40
(52) U.S. Cl. ................................. 343/703; 343/850
(58) Field of Search ........................... 343/703, 850; 324/637, 123 R, 123 C, 76.44; 455/67.1, 115, 226.1; H04B 1/40

(56) References Cited

U.S. PATENT DOCUMENTS

| | | |
|---|---|---|
| 4,054,837 | 10/1977 | Hibbs, Jr. et al. . |
| 5,471,146 | 11/1995 | Krayeski et al. . |
| 5,507,010 | * 4/1996 | Ahonen ................................. 343/703 |
| 5,543,721 | 8/1996 | Knuuti . |
| 5,764,186 | * 6/1998 | Yoo ..................................... 343/703 |
| 6,031,498 | * 2/2000 | Issler ................................... 343/703 |

* cited by examiner

Primary Examiner—Hoanganh Le
(74) Attorney, Agent, or Firm—Fogg, Slifer & Polglaze, P.A.

(57) ABSTRACT

A testing apparatus that comprises an electrical device. A first circuit is in electrical communication with the electrical device. The first circuit including an amplifier. First and second couplers are electrically connected to the first circuit and arranged in series with the amplifier. The amplifier is positioned between the first and second couplers. A second circuit has a first end in electrical communication with the first coupler and a second end in electrical communication with the second coupler. The total gain of the first coupler, the second coupler, the portion of the first circuit between the first and second couplers, and the second circuit is approximately zero.

9 Claims, 2 Drawing Sheets

◄- - - - - TEST SIGNAL PATH
◄─────── MAIN SIGNAL PATH

←  - - - - - TEST SIGNAL PATH
←————— MAIN SIGNAL PATH

APPARATUS AND METHOD FOR DETERMINING RETURN LOSS OF ELECTRICAL DEVICE

TECHNICAL FIELD

The present invention relates to determining return loss of an electrical device, and, more particularly, to bypassing a test signal around a portion of an electrical circuit.

BACKGROUND

The infrastructure for cellular telephone systems, as well as for other mobile communication systems, includes antennas that are typically mounted on towers. The antenna receives radio signals from the cellular telephone, The received radio signal is then transmitted down a transmission line to a base station that is located next to the antenna. The base station then processes the signal and routes the signal to its proper destination such as another cellular telephone or to a telephone company for connection with a wire-line telephone.

The radio signals that are transmitted from the cellular telephones can be very weak. Accordingly, the range of the base-station antenna is limited and the telephone must be fairly close to receive a signal strong having sufficient strength. One way to increase the range of a base-station antenna is to increase the power output by the cellular telephone. However, this method raises health concerns because the antenna for hand-held cellular telephones is placed adjacent to a user's head and brain.

Another way to increase the range of a base-station antenna coverage is to increase its sensitivity. One way to increase a base-stations antenna's sensitivity is to place an amplifier at the top of the tower so that the signal received by the base-station antenna is amplified before it is transmitted along the transmission line to the base station. The amplification increases the strength of the signal and overcomes any loss that occurs as the signal is transmitted from the antenna to the base station. This amplification permits the antenna and base station to effectively receive and process relatively weak signals. As result, the sensitivity and coverage range of the antenna is effectively increased.

When an antenna is mounted in a remote location such as high on a tower, it is advantageous to be able to remotely test it. Remote testing is accomplished by transmitting a signal from the base station to the antenna. If a signal having a certain strength is reflected from the antenna back to the base station, there is an error. For example, this reflected signal may indicate that there is an open circuit in the antenna or that the antenna leaked and is full of water. The ability to remotely test antennas is especially important for several reasons. For example, it permits the antenna to be frequently and periodically tested, which helps to maintain a high level or reliability of the cellular infrastructure. Another reason is that climbing towers, which can be as high as 400 feet or more is dangerous, especially in winter or other adverse weather.

However, an amplifier in the line prevents the test signal from reaching the antenna because of the reverse isolation of the amplifier and thus it cannot be tested. This problem is a serious impediment to being able to use a tower-top amplifier to increase the sensitivity of the antenna. Even if the signal could reach the antenna, the amplifier would present a practical problem because it would amplify the test signal as it is reflected to the base station. As a result, the amplitude of the reflected test signal received at the base station always would be above a certain threshold level, which could falsely indicate a failure in the antenna.

Therefore, there is a need for a system that enables testing of a remote device that has its output amplified. There is a further need for a system for bypassing a portion of the output circuit for a remote device. There is also a need for a system that neutralizes any gain or amplification of a signal that is output from a remote device.

SUMMARY

One embodiment of the present invention is directed to a testing apparatus that comprises a first circuit. The first circuit includes an electrical element and is configured to be placed in electrical communication with the electrical device. A second circuit is in electrical communication with the first circuit and is arranged to bypass an electrical signal around the electrical element. The total gain of the electrical element and the second circuit is a predetermined level.

Another embodiment of the present invention is directed to a testing apparatus that comprises a first circuit. The first circuit is configured to communicate a signal received from the electrical device and includes an electrical element. A second circuit is in electrical communication with the first circuit. The second circuit is arranged to bypass an electrical signal being communicated to the electrical device around the electrical element. The total gain of the electrical element and the second circuit is a predetermined level.

Another possible embodiment of the present invention is directed to a testing apparatus that comprises an electrical device. A first circuit is in electrical communication with the electrical device. The first circuit including an amplifier. First and second couplers are electrically connected to the first circuit and arranged in series with the amplifier. The amplifier is positioned between the first and second couplers. A second circuit has a first end in electrical communication with the first coupler and a second end in electrical communication with the second coupler. The total gain of the first coupler, the second coupler, the portion of the first circuit between the first and second couplers, and the second circuit is approximately zero.

Yet another possible embodiment of the present invention is directed to a method of testing an electrical device. The electrical device is electrically connected to a network. The method comprises transmitting a signal to the network; transmitting the signal from the network to the electrical device; when the electrical device reflects the signal, returning the signal to the network, wherein the total gain of the signal from the network is a predetermined level.

DETAILED DESCRIPTION

Figure 1:
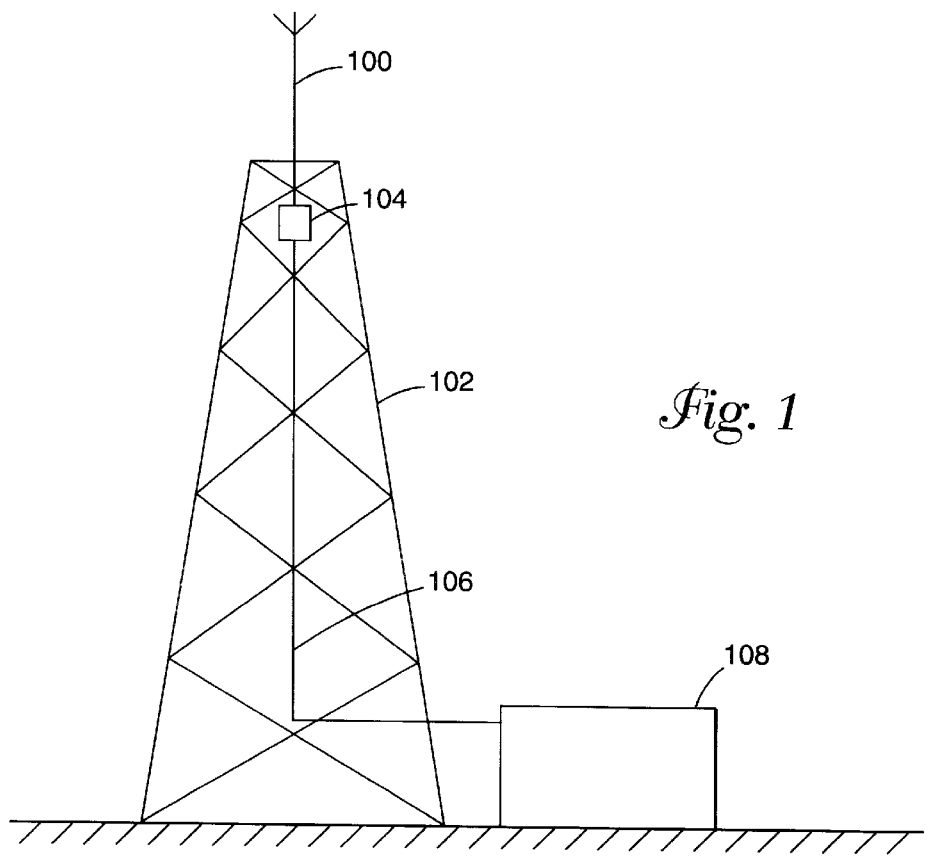
FIG. 1 illustrates a radio tower, which is one possible application for the present invention.

Various embodiments of the present invention, including a preferred embodiment, will be described in detail with reference to the drawings wherein like reference numerals represent like parts and assemblies throughout the several views. Reference to the described embodiments does not limit the scope of the invention, which is limited only by the scope of the appended claims.

In general terms, the present invention is directed to a network that permits the return loss of a device to be measured while the device is connected to an amplifier or other electrical component that has a gain or loss. This invention has many advantages. In a radio application, for example, it permits the output of an antenna to be amplified, which can significantly increase the sensitivity of the antenna. The invention also enables an antenna, or any other type of device, to be remotely and automatically tested even though its output or input is amplified. This ability to remotely test is especially important in applications where an antenna is mounted in a difficult to reach location or is subject to an adverse environment.

Referring now to FIG. 1, an antenna 100 is mounted on a tower 102. The output of the antenna 100 is fed into an electrical network 104 that is mounted in the tower 102 and is proximal to the antenna 100. A transmission line 106 then extends from the electrical network 104, down the tower 102, and to a base station 108. The base station 108 includes radio and cellular telephone equipment (not shown). The base station 108 can send a testing signal up the transmission line 106 for testing the antenna 100.

The test equipment transmits a test signal up the transmission line 106 to the antenna 100. The frequency of the test signal is within the receiving band for the antenna 100. It then monitors the transmission line 106 for any reflection of that signal. In one possible embodiment, a test signal is transmitted to the antenna 100 approximately every half hour. However, the time between test signals can vary.

In one possible embodiment, the test equipment monitors the power of the reflected signal and then calculates the return loss or reflection coefficient, which is $P_R/P_o$, where $P_R$ is the power of the reflected signal and $P_o$ is the power of the original test signal. If the return loss is over a certain threshold value, the test equipment determines that the antenna 100, or some other portion of the system, has failed. The threshold level for the return loss can vary from embodiment to embodiment and can be set to accommodate factors such as the loss over the transmission line 106.

There are a variety of alternative embodiments of this system. For example, the antenna 100 could be mounted on a structure other than a tower. Examples, include water towers, buildings, and bridges. Furthermore, the electrical network 104 is not necessarily mounted directly adjacent to the output of the antenna 100. It could be located anywhere that electrical components, such as an amplifier, are required. Another alternative embodiment uses a value other than the return loss to determine whether the antenna 100 failed.

Figure 2:
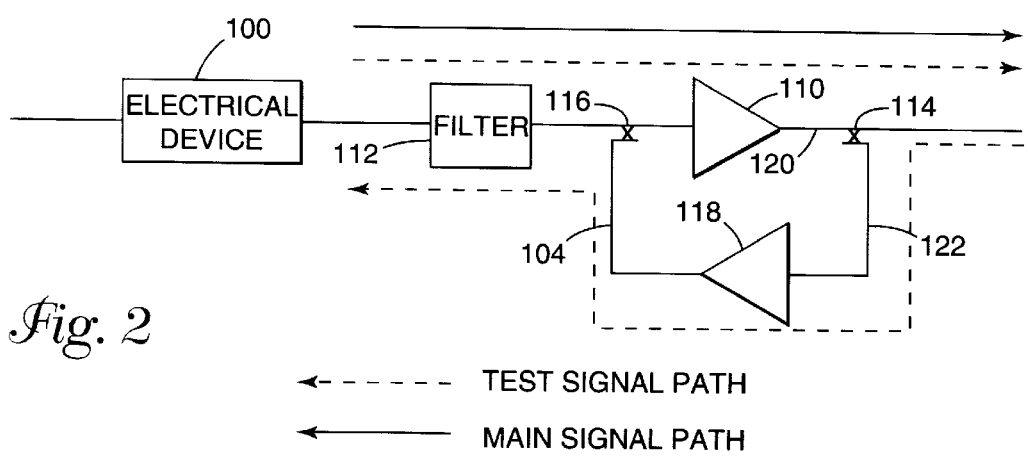
FIG. 2 is a schematic diagram illustrating an electrical network that is mounted on the top of the tower shown in FIG. 1.

Referring now to FIG. 2, the electrical network 104 includes a low noise amplifier (LNA) 110, a filter 112, first and second directional couplers 114 and 116, and a bypass amplifier 118. The output of the antenna 100, filter 112, first directional coupler 114, LNA 110, and second directional coupler 116 are arranged in series. The input for the LNA 110 is electrically connected to the second directional coupler 116, and the output of the LNA 110 is electrically connected to the first directional coupler 114. In this configuration, a first circuit 120 is formed between the first and second directional couplers 114 and 116 and includes the LNA 110.

A second circuit 122 includes the bypass amplifier 118 that has an input in electrical communication with the first directional coupler 114 and an output that is in electrical communication with the second directional coupler 116. The second circuit 122 is parallel to the first circuit 120 and is also electrically connected between the first and second directional couplers 114 and 116. In this arrangement, the second circuit 122 forms a bypass around the amplifier and any other electrical elements that are included in the first circuit 120.

The first directional coupler 114 is configured and arranged so that substantially all of a signal received from the transmission line 106 is directed or flows to the second circuit 122 and substantially all of a signal received from the first circuit 120 flows to the transmission line 106. The second directional coupler 116 is configured so that substantially all of a signal received from the antenna 100 flows to the first circuit 120 and substantially all of a signal received from the second circuit 122 flows to the antenna 100. In this configuration, signals received from the antenna 100 bypass the second circuit 122, and signals received from the transmission line 106 bypass the first circuit 120.

In one possible embodiment, the first and second directional couplers 114 and 116 are integrated couplers such as model no. CH20032, which is manufactured by MACOM. An advantage of an integrated coupler is that they have a relatively small form factor or size. This small size minimizes the overall size of the electronic network 104, which is an advantage when it is mounted at the top of a tower. Another advantage of an integrated coupler is that they can be mounted on the same circuit board as the LNA 110, which further reduces the overall size of the electrical network 104.

In use, the antenna 100 receives radio waves and converts them to electrical signals. The antenna 100 outputs the signal, which then flows through the filter 112 and the second directional coupler 116. The signal is then fed into the amplifier where it is amplified. The amplified signal flows through the first directional coupler 114 to the transmission line 106, which carries it to the base station 108. The radio and cellular equipment in the base station 108 then processes the signal.

The gain or loss of the LNA 110 and any other electrical elements in the first circuit 120 is approximately equal and opposite of the total gain or loss from the first coupler, the second circuit 122, and the second coupler. For example, presume that the gain of the LNA 110 is approximately 15 dB, the loss of each of the directional coupler 114 and 116 is approximately 17 dB, and the gain of the bypass amplifier 118 is approximately 19 dB. Then the total gain for the first circuit 120, second circuit 122, and first and second directional couplers 114 and 116 is: 15 dB+19 dB+(−17 dB)+(−17dB)=0 dB.

An advantage of having a net gain of zero is that the test equipment that monitors the return loss of the test signal does not have to be modified to work with the electrical network 104. This test equipment is generally configured to compensate for any loss of the transmission line 106 between the antenna 100 and the test equipment, but is not configured to compensate for any gain or any additional loss. In other embodiments, however, the test equipment could be configured to compensate for a gain or and additional. In such an embodiment, the total gain or loss of the electrical network 104 can be adjusted to a predetermined level other than zero.

In this arrangement, the loss or negative gain of the directional coupler 114 and 116 and the gain of the bypass amplifier 118 offset the gain of the LNA 110. As a result, a test signal that is reflected from the antenna 100 has a net gain of about zero when it is output from the first directional coupler 114 to the transmission line 106. The test equipment can then measure the strength of the reflected signal and determine whether there is a failure in the antenna 100.

Additionally, it is advantageous to keep the loss of the first and second directional couplers 114 and 116 to a minimum because they are in the path of any signals received from the antenna 100. Any adjustment to the net gain of the electrical network 104 can then be made by adjusting the gain of the bypass amplifier 118. In other possible embodiments and applications, however, the loss of the first and second directional couplers 114 and 116 is not minimized.

Figure 3:
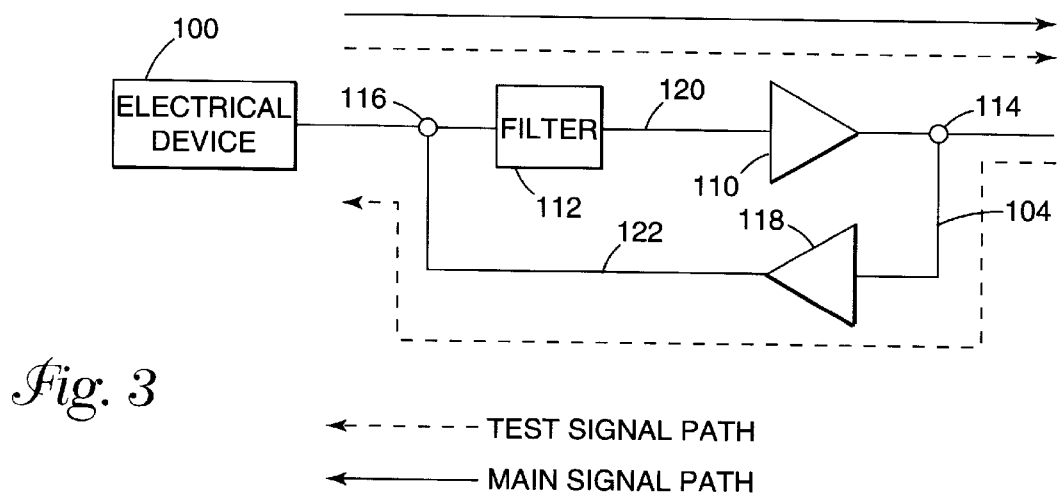
FIG. 3 is a schematic diagram illustrating an alternative embodiment of the electrical network shown in FIG. 2.

Many different embodiments of the present invention are possible. Referring to FIG. 3, for example, an alternative embodiment includes an antenna 100, an amplifier, a filter 112, and first and second directional couplings, as described above. However, the filter 112 is in the first circuit 120 and is in series between the amplifier and the second directional coupling. The insertion loss of the filter 112 may be low enough so that it is negligible for balancing the gain of the first circuit 120, the second circuit 122, and the directional coupler 114 and 116. If the filter 112 does have more than a negligible gain or loss, the total gain or loss of the directional coupler 114 and 116 or the second circuit 122 can be adjusted. There are several possible ways to adjust the insertion loss of the second circuit 122 including changing the insertion loss of the directional coupler 114 and 116 and changing the gain of the bypass amplifier 118.

Other embodiments of the present invention are also possible. For example, the first circuit 120 can include electrical components other than, or in place of, the LNA 110. Additionally, other types of amplifiers can be used in place of the LNA 110. Similarly, other embodiments include electrical components in the second circuit 122 other than, or in place of, the bypass amplifier 118. The bypass amplifier 118 can be any type of amplifier. In yet another embodiment, there are not any electrical components in the second circuit 122. In this embodiment, the loss of the first and second directional couplers 114 and 116 alone offsets the gain of the LNA 110.

Still other embodiments use different types of directional couplers to control the flow of signals between the antenna 100, the first circuit 120, the second circuit 122, and the transmission line 106. A micro stripline is an example of a device that can be used in place of an integrated circuit for the first and second directional couplers 114 and 116. Additionally, any other structure that has parameters of coupling and directivity can be used to control the flow of a test signal through the electrical network 104 in place of the first and second directional couplers 114 and 116.

Additionally, any type or structure of filter can be used for the filter 112. For example, the filter 112 can be a bandpass filter, band stop filter, a lowpass filter, a highpass filter, or a notch filter. Examples of structures that can be used include a cavity filter, a helix filter, a micro stripline, discrete components, and integrated circuits. Furthermore, the filter 112 can have any parameters for attenuation, insertion loss, transmission band, return loss, and phase. However, depending on the amount of gain or loss the filter 112 has, it may be desirable to include the filter 112 within the first circuit 120 so that the electrical network 104 can offset its gain or loss in a manner similar to that of the LNA 110.

The embodiment described herein is discusses in terms of testing an antenna in a cellular system. However, embodiments of the present invention can be used to remotely test any type of electrical device where it is necessary to bypass a circuit. Examples of devices that can be tested include antennas for all types, satellites, electrical equipment that is in difficult to reach areas, and electrical equipment that is in hazardous areas such as in nuclear reactors.

While specific embodiments have been described herein, it is evident that other alternatives, modifications, and variations can be made in view of the foregoing description. For example, features of one of the embodiments described above can be combined with features of any of the other embodiments. Alternatively, there can be modifications that are not explicitly taught herein, but still embody the spirit of invention claimed below. Accordingly, the invention is not limited to these embodiments or the use of elements having specific configurations and shapes as presented herein.

The claimed invention is:

1. A method of testing an antenna having a receiving band of frequencies, a first circuit being in electrical communication with the antenna, a second circuit bypassing a portion of the first circuit, the method comprising:

transmitting a signal on the first circuit toward the antenna, the signal being within the receiving band of frequencies for the antenna;

transmitting the signal to the second circuit;

transmitting the signal from the second circuit back to the first circuit for transmission to the antenna, thereby bypassing a portion of the first circuit, wherein the gain of the signal transmitted along the second circuit is a predetermined level;

wherein the gain of the signal transmitted along the second circuit is approximately equal and opposite to the gain of the bypassed portion of the first circuit;

returning the signal along the first circuit wherein the net gain of the signal from the bypassed portion of the first circuit and the second circuit is approximately unity; and filtering the signal as is transmitted along the bypassed portion of the first circuit.

2. The method of claim 1 further comprising amplifying the signal as it is transmitted along the bypassed portion of the first circuit.

3. The method of claim 2 further comprising amplifying the signal as it is transmitted along the second circuit.

4. A method of testing an antenna having a receiving band of frequencies, a first circuit being in electrical communication with the antenna, a second circuit bypassing a portion of the first circuit, the method comprising:

transmitting a signal on the first circuit toward the antenna, the signal being within the receiving band of frequencies for the antenna;

transmitting the signal to the second circuit;

transmitting the signal from the second circuit back to the first circuit for transmission to the antenna, thereby bypassing a portion of the first circuit, wherein the gain of the signal transmitted along the second circuit is a predetermined level;

wherein the gain of the signal transmitted along the second circuit is approximately equal and opposite to the gain of the bypassed portion of the first circuit;

returning the signal along the first circuit wherein the net gain of the signal from the bypassed portion of the first circuit and the second circuit is approximately unity; and wherein transmitting the signal to the second circuit includes transmitting the signal through a first directional coupler, the first directional coupler providing electrical communication between the first and second circuits.

5. The method of claim 4 further comprising amplifying the signal as it is transmitted along the bypassed portion of the first circuit.

6. The method of claim 5 further comprising amplifying the signal as it is transmitted along the second circuit.

7. The method of claim 4 wherein transmitting the signal to the first circuit includes transmitting the signal through a second directional coupler, the second directional coupler providing electrical communication between the first and second circuits, the bypassed portion of the first circuit being between the first and second directional couplers.

8. The method of claim 7 further comprising amplifying the signal as it is transmitted along the bypassed portion of the first circuit.

9. The method of claim 8 further comprising amplifying the signal as it is transmitted along the second circuit.

* * * * *